US011802337B1

(12) United States Patent
Gandhiraman et al.

(10) Patent No.: US 11,802,337 B1
(45) Date of Patent: Oct. 31, 2023

(54) ATMOSPHERIC PRESSURE PLASMA BASED FABRICATION PROCESS OF PRINTABLE ELECTRONICS AND FUNCTIONAL COATINGS

(71) Applicant: United States of America as Represented by the Administrator of the NASA, Washington, DC (US)

(72) Inventors: Ramprasad Gandhiraman, Sunnyvale, CA (US); Vivek Jayan, Cleveland, OH (US); Meyya Meyyappan, Pacifica, CA (US); Jessica Koehne, Portola Valley, CA (US)

(73) Assignee: United States of America as Administrator of NASA, Washington, DC (US)

( * ) Notice: Subject to any disclaimer, the term of this patent is extended or adjusted under 35 U.S.C. 154(b) by 167 days.

(21) Appl. No.: 17/216,627

(22) Filed: Mar. 29, 2021

Related U.S. Application Data

(63) Continuation of application No. 16/282,161, filed on Feb. 21, 2019, now abandoned, which is a continuation of application No. 14/515,072, filed on Oct. 15, 2014, now abandoned.

(60) Provisional application No. 61/932,609, filed on Jan. 28, 2014.

(51) Int. Cl.
  *C23C 16/453* (2006.01)
  *H01J 37/32* (2006.01)
  *B05D 3/04* (2006.01)

(52) U.S. Cl.
  CPC .............. *C23C 16/453* (2013.01); *B05D 3/04* (2013.01); *H01J 37/32348* (2013.01)

(58) Field of Classification Search
  CPC ...... C23C 16/453; C23C 16/50; C23C 16/513
  See application file for complete search history.

(56) References Cited

U.S. PATENT DOCUMENTS

| 3,958,883 A | 5/1976 | Turner |
| 4,990,740 A | 2/1991 | Meyer |
| 5,477,048 A | 12/1995 | Nakagawa et al. |

(Continued)

FOREIGN PATENT DOCUMENTS

| EP | 2621006 A1 * | 7/2013 | ............. H01M 4/90 |
| WO | WO 2012/141436 A2 * | 10/2012 | ............. B41M 1/14 |

OTHER PUBLICATIONS

Kan, C.W., et al., "Using atmospheric pressure plasma for enhancing the deposition of printing paste on cotton fabric for digital ink-jet printing". Cellulose (2011) 18:827-839.*

(Continued)

*Primary Examiner* — Bret P Chen
(74) *Attorney, Agent, or Firm* — Rhys W. Cheung; Robert M. Padilla; Trenton J. Roche

(57) ABSTRACT

Methods for generating one or more atmospheric pressure plasma jets that can be used to deposit various types of conductive traces, coatings, and micro/nano-sized particles/structures on two or three dimensional body surfaces. The method includes generating atmospheric pressure plasma, nebulizing a precursor to generate an aerosol; receiving the aerosol from the nebulizer in a chamber; mixing the atmospheric pressure plasma with the aerosol from the chamber at a nozzle; and printing the plasma-exposed aerosol onto the surface of a substrate.

**30 Claims, 11

(56) References Cited

U.S. PATENT DOCUMENTS

| | | | | |
|---|---|---|---|---|
| 6,109,175 | A | * | 8/2000 | Kinoshita .............. H05K 3/207 29/829 |
| 2003/0190419 | A1 | * | 10/2003 | Katagami ......... G02F 1/133516 118/300 |
| 2005/0020038 | A1 | * | 1/2005 | Mikhael ............ H01J 37/32724 438/485 |
| 2005/0218319 | A1 | | 10/2005 | Bandura et al. |
| 2006/0038992 | A1 | * | 2/2006 | Morrisroe .............. G01N 21/68 356/316 |
| 2006/0051505 | A1 | | 3/2006 | Kortshagen et al. |
| 2008/0145553 | A1 | | 6/2008 | Boulos et al. |
| 2008/0200969 | A1 | * | 8/2008 | Weber ...................... A61N 1/06 374/E13.002 |
| 2009/0065485 | A1 | * | 3/2009 | O'Neill .................... H05H 1/46 219/121.48 |
| 2011/0272386 | A1 | | 11/2011 | Morrisroe |
| 2011/0298376 | A1 | | 12/2011 | Kanegae et al. |
| 2012/0236614 | A1 | * | 9/2012 | Kamata ................. H02M 7/537 363/131 |
| 2012/0326128 | A1 | * | 12/2012 | Shin ....................... B82Y 30/00 977/734 |
| 2013/0052248 | A1 | * | 2/2013 | Yuen ...................... A61P 31/04 424/617 |
| 2013/0108804 | A1 | * | 5/2013 | Massines .............. C23C 16/509 118/723 E |
| 2013/0153884 | A1 | * | 6/2013 | Ichikawa ............ H01L 51/0076 546/37 |
| 2013/0228221 | A1 | * | 9/2013 | Moslehi .............. H01L 31/1892 438/98 |
| 2013/0281583 | A1 | * | 10/2013 | Zhu ..................... H01L 27/1262 257/E21.259 |
| 2014/0087085 | A1 | | 3/2014 | Gruenler et al. |
| 2014/0131906 | A1 | | 5/2014 | Hadidi et al. |
| 2017/0183512 | A1 | * | 6/2017 | Han ....................... H01G 11/70 |

OTHER PUBLICATIONS

Park, Jae Beom, et al., "Polymer surface texturing for direct inkjet patterning by atmospheric pressure plasma treatment". Soft Matter, 2012, 8, 5020, pp. 5020-5026.*

Ayan, Halim, et al., "Development of a cold atmospheric pressure microplasma jet for freeform cell printing". Applied Physics Letters 99, 111502 (2011), pp. 1-3.*

Ramamurti, Rahul, et al., "Atmospheric Pressure Plasma Printing of Nanomaterials for IoT Applications". IEEE Open Journal of Nanotechnology, vol. 1, 2020, pp. 47-56.*

Massines, Francoise, et al., "Atmospheric pressure plasma deposition of thin films by Townsend dielectric barrier discharge". Surface & Coatings Technology 200 (2005) 1855-1861.*

Mori, Y., et al., "Atmospheric pressure plasma chemical vapor deposition system for high-rate deposition of functional materials". Review of Scientific Instruments, vol. 71, No. 8, Aug. 2000, pp. 3173-3177.*

Anand, Venu, et al., "Atmospheric pressure plasma chemical vapor deposition reactor for 100mm wafers, optimized for minimum contamination at low gas flow rates". Appl. Phys. Lett. 107, 094103 (2015); pp. 1-5.*

Souza-Corrêa, J.A., et al., "Atmospheric Pressure Plasma Pretreatment of Sugarcane Bagasse: the Influence of Biomass Particle Size in the Ozonation Process". Appl Biochem Biotechnol (2014) 172:1663-1672.*

Orlov, Dmitiy, et al., "Electric Circuit Model for Aerodynamic Plasma Actuator". AIAA 44th Aerospace Sciences Meeting, Jan. 9-12, 2006, Reno,Nevada, pp. 1-10/.*

Brandenburg, Ronny, "Corrigendum: Dielectric barrier discharges: progress on plasma sources and on the understanding of regimes and single filaments (2017PlasmaSources Sci.Technol.26053001)". Plasma Sources Sci.Technol. 27 (2018) 079501, pp. 1-30.*

Carrilho, et al., Paper Microzone Plates, Analytical Chemistry, Jul. 2, 2009, 5990-5998, 81, 2009 American Chemical Society.

Connor, et al., Room temperature deposition of tunable plasmonic nanostructures by atmospheric pressure jet plasma, J. Mater. Chem., Mar. 29, 2012, 9485-9489, 22.

Li, et al., Paper-Based Microfluidic Devices by Plasma Treatment, Anal. Chem., Nov. 1, 2008, 9131-9134, 80, 2008 American Chemical Society.

Mahajan, et al., Optimization of Aerosol Jet Printing for High-Resolution, High-Aspect Ratio Silver Lines, ACS Appl. Mater. Interfaces, May 9, 2013, 4856-4864, 5.

Palgrave, et al., Aerosol Assisted Chemical Vapor Deposition Using Nanoparticle Precursors: A Route to Nanocomposite Thin Films, J. Am. Chem. Soc., Jan. 13, 2006, 1587-1597, 128.

Siegel, et al., Foldable printed circuit boards on paper substrates, Adv. Funct. Mater., 2010, 28-35, 20, 2010 Wiley-Vch Verlag GmbH & Co.

Ward, et al., Atmospheric Pressure Plasma Deposition of Structurally Well-Defined Polyacrylic Acid Films, Chem. Mater., Mar. 11, 2003, 1466-1469, 15, 2003 American Chemical Soc.

Yang, et al., Preparation of Active Layers in Polymer Solar Cells by Aerosol Jet Printing, ACS Appl. Mater. Interfaces, Sep. 14, 2011, 4053-4058, 3, ACS Publications.

* cited by examiner

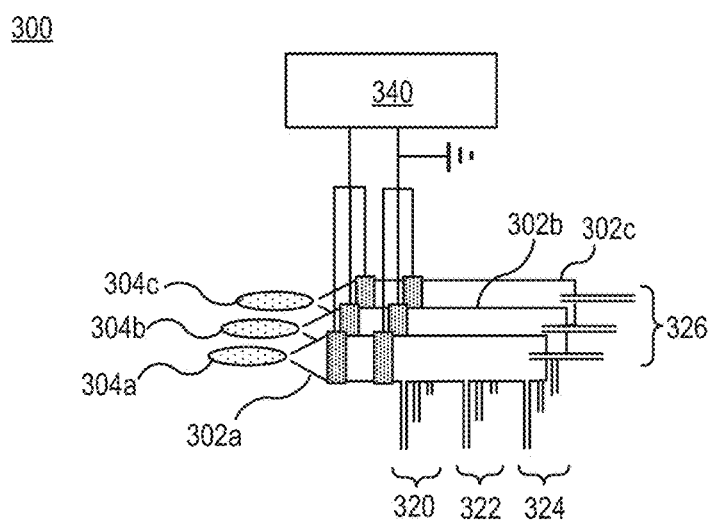
FIG. 3
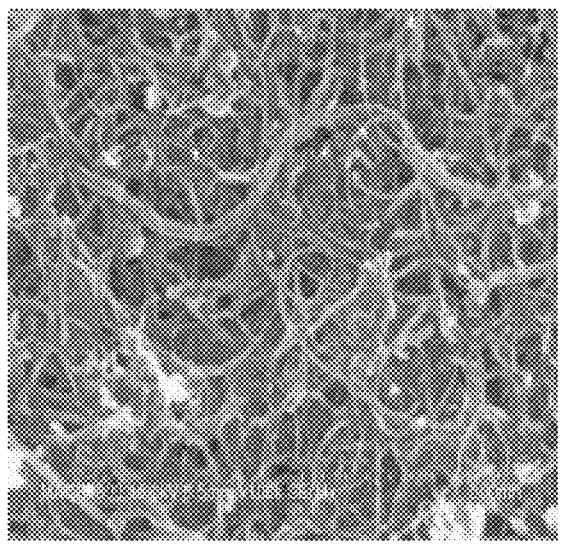 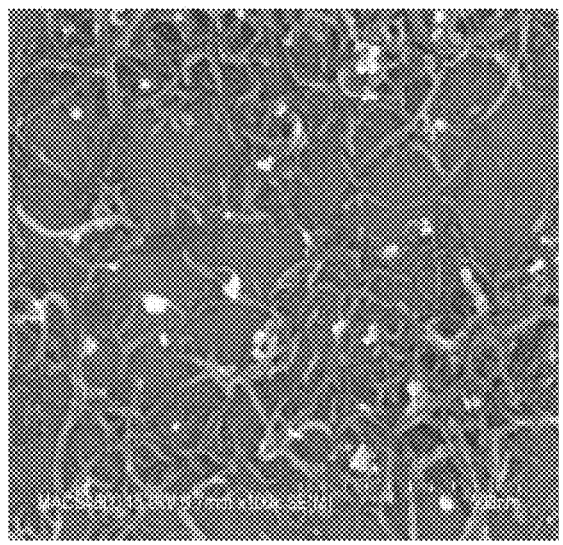
FIG. 4A  FIG. 4B

US 11,802,337 B1

ATMOSPHERIC PRESSURE PLASMA BASED FABRICATION PROCESS OF PRINTABLE ELECTRONICS AND FUNCTIONAL COATINGS

CROSS REFERENCE TO RELATED APPLICATIONS

This application claims the benefit of U.S. Provisional Application No. 61/932,609, entitled "Atmospheric Pressure Plasma Based Fabrication of Printable Electronics and Functional Coatings," filed on Jan. 28, 2014, which is hereby incorporated herein by reference in its entirety. This application is a continuation of U.S. patent application Ser. No. 16/282,161, filed Feb. 20, 2019, which is a continuation of U.S. patent application Ser. No. 14/515,072, filed Oct. 14, 2014, which are hereby incorporated herein by reference in their entireties.

ORIGIN OF THE INVENTION

The invention described herein was made in the performance of work under a NASA contract and by an employee of the United States Government and is subject to the provisions of Public Law 96-517 (35 U.S.C. § 202) and may be manufactured and used by or for the Government for governmental purposes without the payment of any royalties thereon or therefore. In accordance with 35 U.S.C. § 202, the contractor elected not to retain title.

FIELD OF THE INVENTION

The present invention relates to plasma processing, and more particularly, to aerosol-assisted deposition using atmospheric pressure plasma.

BACKGROUND OF THE INVENTION

The need for low cost and environmentally-friendly processes for fabricating printable electronics and biosensor chips is rapidly growing. In the fabrication of electrode materials for solar cells and printable electronics incorporating metal and semiconductor nanostructures, the research has been focused on drop casting with drying, immersion, spin coating and, more recently, aerosol deposition.

With the advancement of flexible electronics and wearable monitoring devices, the need for very simple and high throughput fabrication process is growing. Nanomaterials have been applied to both printable electronics and chemical and biosensors for signal transduction and amplification. The existing fabrication techniques have multiple processing steps. Also, the existing fabrication techniques, such as vacuum based chemical vapor deposition and plasma enhanced chemical vapor deposition, require high temperature environments for the growth of nanostructures, restricting the materials for substrates. Also, the need for vacuum results in additional costs through vacuum pumps and energy resources.

The conventional wet process-based growth techniques for depositing metal and/or semiconductor nanostructures on substrates have technical difficulties. For example, the conventional drop casting of nanostructures results in very poor adhesion. In another example, the conventional printing technology for printing and patterning conductive traces and insulating coatings at room temperature cannot be applied to complex three dimensional surfaces. In yet another example, recent developments in ink jet printing are only applicable to limited materials for substrates.

Paper based sensors are the most recent developments in the biodiagnostics field. In order to use filter papers as biosensor chips, the papers need modification to incorporate microfluidics and surface treatment for fluid transport, nanostructures for biomolecule detection and/or signal amplification/transduction, and chemical functionalization for bioassays. Development of multifunctional paper platforms by combining these functionalities requires several processing steps and use of different platforms/tools including high precision printing, patterning, lithography, surface modification, drop casting, and drying.

Each processing step requires a set of separate processing tools, such as masks, UV source, and plasma chamber for lithography. For example, the exposure of channels to oxygen plasma increases the wettability of the channels, but this technique is known to be transient in nature and highly time dependent and hence would affect the longevity of the sensor chip. Use of wet chemical process/drop casting adds another processing steps. Also, poor sensitivity of the chips is a serious concern. There is no one single tool that can perform most of the steps for the conventional fabrication processes and at the same time provide high sensitive chip surfaces.

Plasma printing of conductive traces, insulating coatings, and nanostructures will enable manufacturing of parts in space as and when the need arises. However, carrying the conventional plasma apparatus from the earth to an international space station (ISS) is an expensive mission due to the heavy weight of the apparatus. For biodiagnostics in space, developing paper-based diagnostic devices is highly desirable in microgravity environments as the fluid transport in paper is driven by wicking. However, in the conventional approaches, controlling the fluid flow in sensor chips is a challenging task.

Thus, there is a need for a system that can generate atmospheric room-temperature plasma for fabrication of printable electronics and functional coatings on two and three dimensional objects, textiles, and porous materials for both terrestrial commercial applications and use in space missions.

SUMMARY OF THE INVENTION

Embodiments of the present invention includes an apparatus for generating plasma, where the apparatus includes: a nebulizer for generating aerosol of a precursor; a chamber for receiving the aerosol from the nebulizer, a wall of the chamber having a drain to collect droplets condensed from the aerosol; a nozzle for mixing a first gas with the aerosol from the chamber; and a pair of electrodes disposed on an outside wall of the nozzle and adapted to turn the first gas into plasma during operation, wherein the plasma containing the aerosol exits the nozzle at an atmospheric pressure.

Some features and advantages of the invention have been generally described in this summary section; however, additional features, advantages, and embodiments are presented herein or will be apparent to one of ordinary skill in the art in view of the drawings, specification, and claims hereof. Accordingly, it should be understood that the scope of the invention is not limited by the particular embodiments disclosed in this summary section.

BRIEF DESCRIPTION OF THE DRAWINGS

References will be made to embodiments of the invention, examples of which may be illustrated in the accompanying figures. These figures are intended to be illustrative, not limiting. Although the invention is generally described in the context of these embodiments, it should be understood that it is not intended to limit the scope of the invention to these particular embodiments.

FIG. 3 shows a schematic diagram of a system for generating atmospheric pressure plasma according to embodiments of the present invention.

FIGS. 4A and 4B show scanning-electron-microscopy (SEM) images of carbon nanotubes deposited on a silicon wafer using an aerosol spray with and without turning on the atmospheric room-temperature plasma in the system of FIG. 1 (or FIG. 3), respectively.

DETAILED DESCRIPTION OF THE PREFERRED EMBODIMENTS

Figure 1:
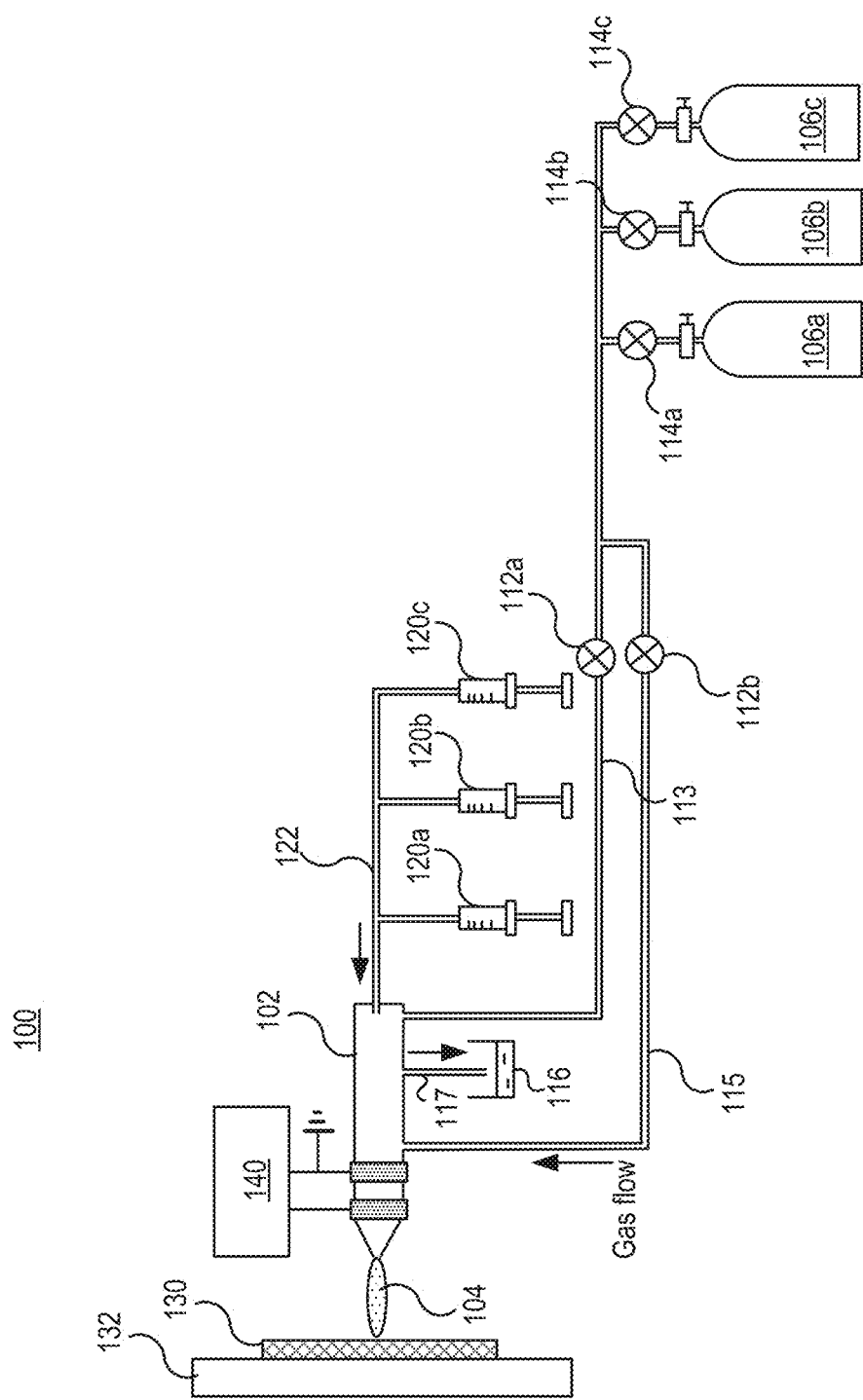
FIG. 1 shows a schematic diagram of a system for generating atmospheric pressure plasma according to embodiments of the present invention.

In the following description, for purposes of explanation, specific details are set forth in order to provide an understanding of the invention. It will be apparent, however, to one skilled in the art that the invention can be practiced without these details. Furthermore, one skilled in the art will recognize that embodiments of the present invention, described below, may be implemented in a variety of ways, such as a process, an apparatus, a system, a device, or a method on a tangible computer-readable medium.

Reference in the specification to "one embodiment," "preferred embodiment," "an embodiment," or "embodiments" means that a particular feature, structure, characteristic, or function described in connection with the embodiment is included in at least one embodiment of the invention and may be in more than one embodiment. The appearances of the phrases "in one embodiment," "in an embodiment," or "in embodiments" in various places in the specification are not necessarily all referring to the same embodiment or embodiments.

It should be noted that steps or operations may be performed in different orders or concurrently, as will be apparent to one of skill in the art. And, in some instances, well known process operations have not been described in detail to avoid unnecessarily obscuring the present invention.

Components shown in diagrams are illustrative of exemplary embodiments of the invention and are meant to avoid obscuring the invention. It should also be understood that throughout this discussion that components may be described as separate functional units, which may comprise sub-units, but those skilled in the art will recognize that various components, or portions thereof, may be divided into separate components or may be integrated together, including integrated within a single system or component. It should be noted that functions or operations discussed herein may be implemented as components. Components may be implemented in software, hardware, or a combination thereof.

Embodiments of the present invention include apparatus and methods for stable, well adherent and repeatable deposition of nanomaterials, organic and inorganic functional coatings by aerosol-combined atmospheric and room-temperature plasma. In embodiments, the atmospheric pressure plasma apparatus is capable of printing and patterning conductive traces made of metal micro/nanostructures (nanowires, nanospheres, and nanoprisms), carbon nanotubes, conductive polymers, insulating and dielectric coatings, organic functionalities and inorganic coatings. In embodiments, the atmospheric pressure plasma apparatus may be applied for room temperature deposition in which an aerosol carrying at least one of the desired substances for deposition is introduced into a cold plasma jet operated at atmospheric pressure. In embodiments, the atmospheric pressure plasma apparatus may perform multiple functions with superior deposition capabilities. The multiple functions include (a) plasma pre-treatment to increase adhesion, (b) highly uniform and enhanced deposition of nanostructures on various substrates, and (c) plasma post-treatment to remove moisture. Also, in embodiments, the atmospheric pressure plasma apparatus may be applied to deposit multiple components, such as conductive traces, semiconductor materials, and dielectric coatings, to fabricate electronic devices.

In embodiments, the atmospheric pressure plasma is cold atmospheric plasma with a dielectric barrier. The atmospheric pressure plasma causes minimal or no thermal effect on the substrates. In embodiments, the atmospheric pressure plasma may serve as a versatile tool for patterning electrical connects and insulating coatings. For instance, the atmospheric pressure plasma may be used to print conductive traces on a rough non-uniform 3D printed object made of acrylonitrile butadiene styrene (ABS) thermoplastic. In another example, the atmospheric pressure plasma may enable integration of electronic components in textiles that can be applied to wearable devices for monitoring astronauts, athletes and patients.

FIG. 1 shows a schematic diagram of a system 100 for generating atmospheric pressure plasma according to embodiments of the present invention. As depicted, the system 100 includes: a plasma generator 102 for generating plasma (or plasma jet/plume) 104; gas supply 106a-106c for supplying gases to the plasma generator 102 via gas lines 113 and 115; gas flow control units 112a-112b and 114a-114c for controlling gas flow rate in the gas lines 113 and 115; one or more pumps 120a-120c for containing precursor material (such as nanocolloids) and supplying the precursor material to the plasma generator 102 via a tube 122; a power supply 140 for supplying electrical power to the plasma generator 102; and a drain container 116 for containing precursor material drained from the plasma generator 102 via a tube 117. In embodiments, the precursor material (or, shortly precursor) may be in the form of colloid, liquid, gas, gel, powder, solid, monomer, polymer, or combination thereof.

The plasma jet 104 may be applied to a substrate 130 mounted on a substrate holder 132, such as automated x-y translation stage. It is noted that other suitable types of substrate holder may be used to hold and move the substrate 130 relative to the plasma jet 104. For instance, the plasma jet 104 may be used to print conductive traces on the surface of a three dimensional substrate. In such a case, the substrate holder 132 may rotate as well as translate in a three dimensional space. The gas supply 106a-106c may include one or more gas containers for storing various gases, such as Ar, $CO_2$, nitrogen, oxygen, methane, acetylene, He, air, and any combination thereof. For brevity, only three gas tanks/storages are shown in FIG. 1. However, it should be apparent to those of ordinary skill in the art that other suitable number of gas tanks may be used in the system 100.

For brevity, only three pumps 120a-120c are shown in FIG. 1. However, it should be apparent to those of ordinary skill in the art that other suitable number of pumps may be connected to the tube 122 to provide various precursors and/or nanocolloids. Each pump, which may be a syringe controlled by a controller (not shown in FIG. 1), contains precursor that has material to be coated/printed on the surface of the substrate 130. It is noted that other suitable types of precursor supplying mechanisms may be used in place of the pumps.

Figure 2:
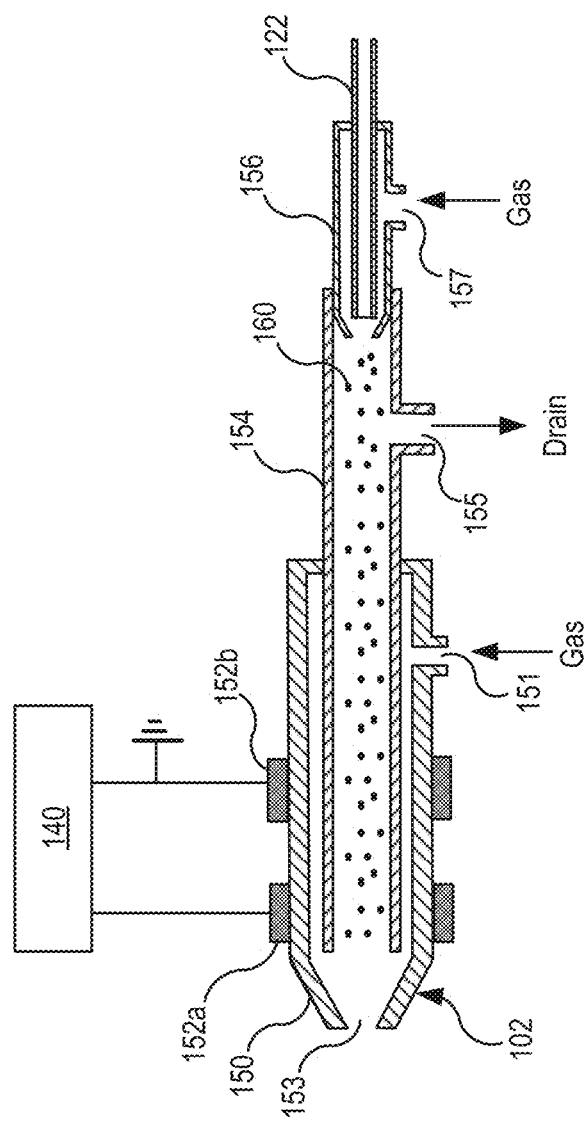
FIG. 2 shows a schematic cross sectional view of a plasma generator in FIG. 1, taken along a plane parallel to the paper.
Figure 5A:
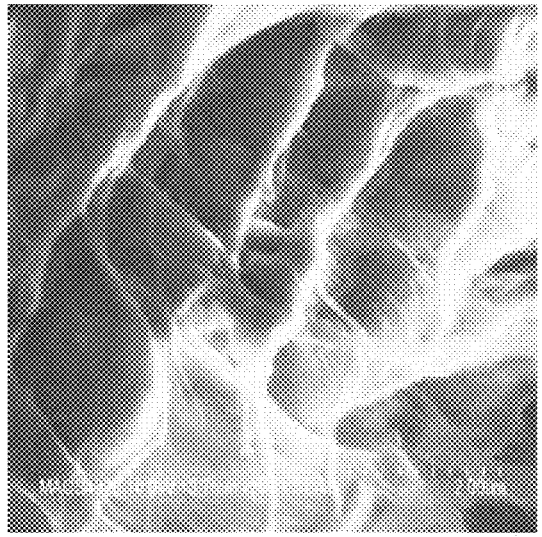
FIGS. 5A-5D show SEM images of untreated nitro cellulose paper, carbon nanotubes deposited on paper, gold nanoparticles deposited on paper, and silver nanowires deposited on paper, respectively, where the carbon nanotubes, gold nanoparticles, and silver nanowires are deposited using the system in FIG. 1 (or FIG. 3).
Figure 5B:
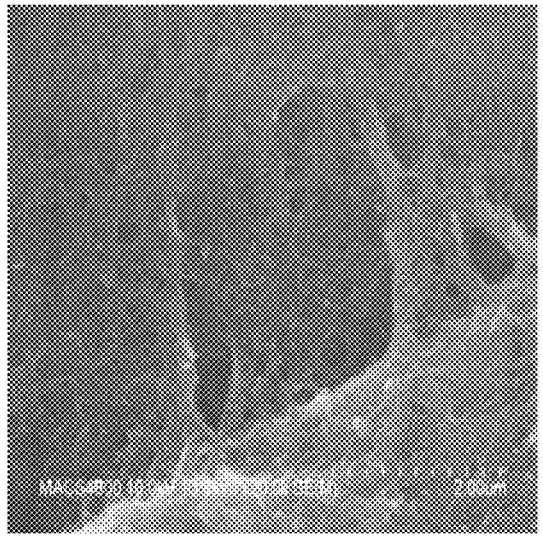
Figure 5C:
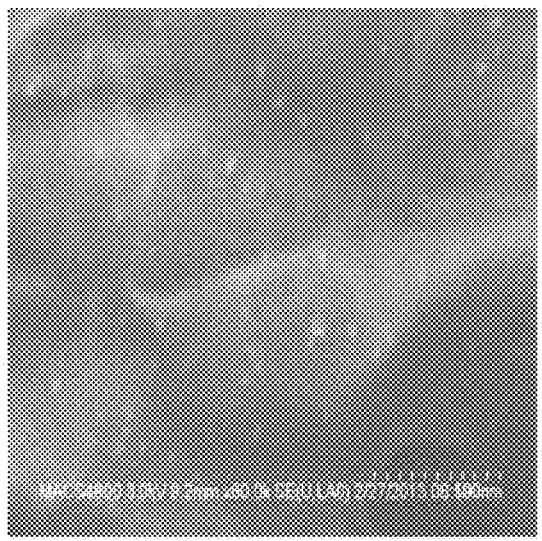
Figure 5D:
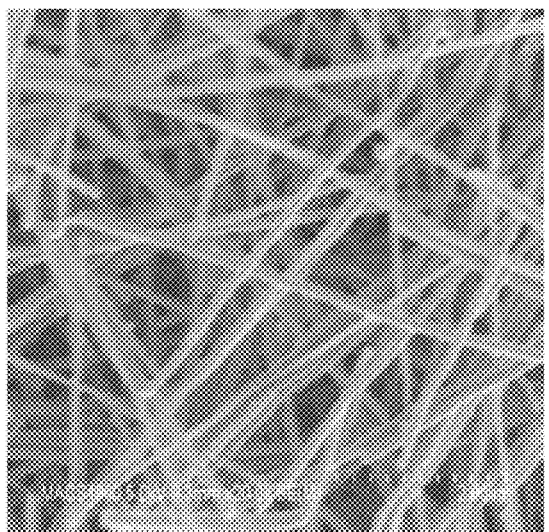

FIG. 2 shows a schematic cross sectional view of the plasma generator 102 in FIG. 1, taken along a plane parallel to the paper. As depicted, the plasma generator 102 includes: a spray nebulizer 156 for forming fine mist (or aerosol) 160 of the precursor supplied through the tube 122 (such as capillary); a spray chamber 154 having a generally cylindrical shape to contain the aerosol and coupled to the spray nebulizer 156; a spray nozzle 150 coupled to the spray chamber 154; and a pair of electrodes 152*a* and 152*b* coupled to the power supply 140 and separate from each other by a predetermined distance (such as 3 mm-10 cm), where a preset voltage is applied across the electrodes to generate plasma inside the spray nozzle 150 during operation.

The pair of electrodes 152*a* and 152*b* may be formed of any suitable metal, such as copper. Each of the electrodes may have a suitable shape, such as ring, where the shape of the electrodes affects the characteristics of the plasma 104. The distance between the pair of electrodes 152*a* and 152*b* may be determined considering various factors, such as the configuration, size and nature of the spray nozzle 150.

As discussed above, one or more precursors may be supplied to the plasma generator 102 by suitable pumping mechanisms, such as syringes 120*a*-120*c*. Also, a carrier gas that is supplied through the gas line 113 is introduced into the spray nebulizer 156 via a gas inlet 157. The spray nebulizer 156 has an opening for receiving the tube 122 and an outlet disposed in proximity to the tip of the tube 122. As the precursor reaches the tip of the tube 122, it is bombarded by the carrier gas flow and a fine aerosol is formed in the spray chamber 154. In embodiments, the outlet of the spray nebulizer 156 may have a conical shape.

A portion of the aerosol may condense on the sidewall of the spray chamber 154. The condensed and/or larger droplets (hereinafter, referred to as droplets) may fall into the opening (or drain) 155 formed on the sidewall of the spray chamber 154, to thereby be collected in the drain container 116. The droplets will accumulate over the opening 155 until the negative pressure at the end of the tube (such as capillary) 117 of the drain sucks the excess precursor out. This excessive precursor may be collected in the drain container 116, such as beaker or other suitable container, and may be reused by the pumps 120*a*-120*c* if contamination is not an issue. The reuse is optional, to be determined on a case by case basis.

The finer aerosol particles in the aerosol 160 may have enough momentum to reach the electrode junction and are shielded from ignition by the spray chamber 154, where the spray chamber 154 may be formed of dielectric material, such as glass, pyrex, and quartz.

The primary gas that is supplied through the gas line 115 is introduced into the spray nozzle 150 via a gas inlet 151. This gas is turned into plasma by the pair of electrode 152*a* and 152*b* and accelerated to the exit 153 of the spray nozzle 150. Then, the aerosolized precursor (i.e., the aerosol 160) is introduced into the high energy plasma jet and also accelerated out of the nozzle exit 153 to a relatively fine spot size. The spot size of the plasma jet 104 may be adjusted by controlling various parameters, such as the exit diameter of the spray nozzle 150. In embodiments, an additional gas line (not shown in FIGS. 1 and 2) may be used to supply gas via the gas inlet 151 to facilitate plasma ignition as well as focus the spot size of the plasma jet 104. Helium may be used as the primary gas though other inert gases, such as argon and nitrogen, may be used as well. Different gases may require different operating voltages depending on their own ionization potential.

The characteristics of the plasma jet 104 are determined by at least one of the following parameters: voltage applied to the electrodes 152*a* and 152*b*, separation between the electrodes 152*a* and 152*b*, configuration of the electrodes 152*a* and 152*b*, distance between the electrodes 152*a* and 152*b*, nature of the primary gas, ratio between the flow rate of the primary gas and the flow rate of the precursor, diameter of the tube 122, flow rate of the primary gas into the inlet 151, and flow rate of the precursor through the tube 122.

In embodiments, the spray nebulizer 156 may be made of quartz and have a diameter ranging from 100 micrometer to 5 cm. The flow rate of the precursor received through the tube 122 may range from 1 microliter per minute (μL/min) to 5 milliliter/min (mL/min). In embodiments, the spray chamber 154 may have a substantially cylindrical shape and its diameter may range from 1 cm to 10 cm. In embodiments, the spray nozzle 150 may have a cylindrical portion and a conical portion, where the diameter of the cylindrical portion may range 100 μm to 5 cm. The length of the spray nozzle 150 may range from 1 cm to 10 cm, where the pair of electrodes 152a and 152b may be made of copper and the distance between the electrodes may range from 5 mm to 10 cm. In embodiments, the flow rate of the primary gas ranges from 100 sccm to 5000 sccm and the gas line 115 is used for introducing sufficient gas species to facilitate plasma discharge as well as focus the spot size. In embodiments, the carrier gas carried through the gas line 113 has a flow rate ranging from 100 sccm to 5000 sccm.

In embodiments, the power supply 140 may apply a high voltage (between 200V to 15 kV) between the pair of electrodes 152a and 152b, causing the gas in the spray nozzle 150 to turn into atmospheric plasma 104.

FIG. 3 shows a schematic diagram of a system 300 for generating atmospheric pressure plasmas 304a-304c according to embodiments of the present invention. The system 300 is similar to the system 100, with the difference that the system has multiple plasma generators 302a-302c for depositing multiple materials either simultaneously or sequentially on a substrate and for high throughput processing. Each of the tubes 326 may be connected to pumps/containers having either single precursor or different precursors to facilitate multiple depositions. In embodiments, each of the plasma generators 302a-302c may be automated and controlled individually to precisely control the characteristics of deposition.

For brevity, the gas supply coupled to the gas lines 320 and 324 and one or more pumps coupled to the tubes 326 for providing precursors (such as nanocolloids) are not shown in FIG. 3. Likewise, the drain containers coupled to the tubes 322 are not shown in FIG. 3.

In embodiments, the system 100 (or 300) may be used to deposit nanomaterials in a stable, well adherent and repeatable manner and to form organic and/or inorganic functional coatings by aerosol-combined/plasma-based printing. In embodiments, the plasma-based fabrication involves aerosol-assisted room-temperature printing, where the aerosol 160 carrying at least one of the desired substances for deposition is introduced into a cold plasma jet 104 operated at atmospheric pressure. In embodiments, the necessary requisite for the printing/coating process may be the combination of low temperature atmospheric pressure plasma 104 and the aerosol 160 containing the material to be deposited. The deposition on the surface of the substrate 130 is the result of the interaction of the aerosol 160 containing the precursor material with the atmospheric pressure plasma 104 containing the primary gas introduced via the gas inlet 151. The role of atmospheric pressure plasma includes: (i) activation of the material, present in the aerosol, to be deposited and the surface to be coated, (ii) enhancing the adhesion of the material to be deposited on the surface; (iii) facilitating non-aggregated deposition in case of metal nano/microstructures through electrostatic interactions and repulsions within the plasma jet 104 and facilitating plasma polymerization in case of organic and inorganic coating deposition through formation of reactive radicals and ions as the aerosol 160 enters the plasma jet 104; and (iv) post plasma treatment to remove moisture from the deposited nanomaterials. In embodiments, the atmospheric pressure plasma jet 104 may be used to deposit multiple components like conductive traces, semiconductor materials, and dielectric coatings to fabricate electronic devices.

In embodiments, silver nanowire conductive traces, carbon nanotubes, and $SiO_2$ dielectric coating may be deposited on flexible cellulose acetate-based transparent substrates. For $SiO_2$ deposition, the system 100 (or 300) may be used to integrate processes that conventionally require multiple deposition tools including high vacuum physical vapor deposition (sputtering), chemical vapor deposition, and lithography technologies. In embodiments, sequential deposition of a scratch-resistant dielectric coating on conductive traces may be performed, where the sequential deposition is essential for the fabrication of flexible electronic devices.

In embodiments, the system 100 (or 300) may be used to print conductive traces on a rough, non-uniform 3D object made of acrylonitrile butadiene styrene (ABS) thermoplastic and also on flexible cotton textiles. For the deposition of conductive traces and/or semiconducting regions, the precursor colloids containing carbon nanotubes or metal micro/nanostructures or conductive polymers may be provided by the pumps 120a-120c. For insulating, dielectric, inorganic and organic coatings, appropriate precursors containing the monomers may be provided to the system 100 (or 300) and polymerized by the plasma jet 104 (or 304). In embodiments, a wide range of materials/coatings may be deposited on two and/or three dimensional objects and on porous substrates. Followings are exemplary applications of the system 100 (or 300).

Aerosol Assisted Plasma Deposition

In embodiments, the system 100 (or 300) may be used as a means for depositing micro/nanostructures on two and three dimensional objects/surfaces, textiles, and flexible substrates, with good adhesion to the surfaces thereof. The micro/nanostructures may include, but not limited to, conductive materials including carbon nanotubes; metal nanowires/nanorods/nanospheres/nanoprisms/nanotubes/nanopowders of gold, silver, platinum, copper and other metals; semiconductor materials with p type, n type, low bandgap and wide band gap materials including nanowires/nanorods/nanospheres/nanoprisms/nanotubes/nanopowders of silicon, germanium, zinc oxide, zinc telluride, gallium arsenide, gallium nitride, and boron nitride.

Atmospheric Pressure Aerosol-Assisted
Plasma-Enhanced Chemical Vapor Deposition
(PECVD)

In embodiments, the system 100 (or 300) may be used as a means for forming functional coatings on two or three dimensional surfaces or porous substrates using either volatile or nonvolatile precursors or a combination of the two. The functional coatings may include conducting polymers for electronics to form conductive traces; dielectric coatings, such as coating of silicon oxide and/or high and low k dielectrics materials; organic coatings containing functional groups, such as amines, carboxyl, aldehyde, carbonyl, polyethylene glycol, fluorinated, hydroxyl, ethylene oxide, ethylene glycol alcohol, polyvinyl alcohol, and hydrogels, and positively and/or negatively charged coatings for various applications including electronics, biosensors, and printing. In embodiments, depositions may be performed to retain the functionality of the plasma-deposited coating such that the required characteristics can be achieved by using appropriate plasma parameters.

Atmospheric Pressure Plasma as a Source of UV
Radiation

In embodiments, the system 100 (or 300) may be used for lithographically patterning paper and creating hydrophobic and/or hydrophilic regions/channels in the paper. Unlike the conventional works that use a vacuum-based plasma system and a mask, in embodiments, the atmospheric pressure plasma 104 (or 304) may be used to lithographically pattern paper without using the conventional vacuum system and mask. In embodiments, the system 100 (or 300) may be modified to incorporate UV sources, like hydroxyls groups, by introducing water in aerosolized form. In embodiments, once the lithographically treated paper is developed, the paper may be exposed to the atmospheric pressure plasma 104 (or 304) to thereby create hydrophilic regions as a post development treatment. It is noted that the system 100 (or 300) may operate at room temperature and atmospheric pressure and function as a direct-writing lithography tool for patterning paper and other substrates.

In embodiments, the system 100 (or 300) may use secondary reagents that are either co-deposited or sequentially deposited with micro/nanostructures and/or with organic, inorganic, semiconductor, dielectric coatings or with plasma treatment in order to tailor a surface that has specific characteristics determined by the individual and/or polymerized components of the resultant film.

In embodiments, the system 100 (or 300) may be capable of doing the following processes at room temperature: (i) printing conductive traces using metallic nanostructures, conducting polymers and carbon nanotubes with tailored electrical characteristics; (ii) incorporating nanostructures, such as nanotubes, nanoparticles, nanorods, and nanowires, with the formation of electronic structures on paper, textiles, plastics, flexible substrates, 3D printed plastics, polymers, and ceramics; (iii) depositing semiconductor materials, such as zinc oxide nanostructures, tin oxide nanostructures, zinc telluride, and silicon nanostructures, but not limited to these examples only; (iv) depositing insulation coatings and dielectric coatings with varying dielectric properties, (v) depositing various bio-reactive organic functionalities (carboxyl, amine, aldehyde, carbonyl etc.) for immobilization of biomolecules (oligos, antibodies, aptamer, enzymes, and DNA) in bioassays; (vi) depositing bio-repellent organic functionalities, such as polyethylene glycol and poly hydroxyl ethylmeth acrylate, to reduce non-specific binding of non-analyte constituents from a biological sample at the detection zone of a biosensing chip and binding analyte components in the non-detection zone resulting in loss of the analyte components at the channels before they are detected; (vii) patterning (UV generation for lithography and maskless patterning) of paper containing photoresist material to create hydrophilic channels; and (viii) modifying surface chemical for tailored wettability and surface energy on the channels. Some examples of the plasma deposition of nanostructures and organic coatings are given below with the applications, where the system 100 (or 300) is used to perform plasma deposition.

Printing of carbon nanotube (CNT) conductive traces on nanoporous nitro cellulose paper: In embodiments, the resistance of the conductive traces may be tailored by carefully controlling the density of deposited carbon nanotube. By independently controlling the process parameters and exposure time of the plasma 104 (or 304), the loading of the nanostructures may be controlled and in turn, the characteristics of the coating may be tailored.

In embodiments, carbon nanotubes deposited by the system 100 (or 300) may be used for printable electronics, chemical sensors for gas/vapor sensing, biosensors through biomolecule immobilization, and signal transduction elements in both labeled and label-free detection systems. For instance, oxidized and other functionalized carbon nanotubes may be used for gas/vapor sensors.

FIGS. 4A and 4B show scanning-electron-microscopy (SEM) images of multi-walled carbon nanotubes (MWCNT) deposited on a Si wafer using aerosol spray with and without turning on the plasma in the system 100 (or 300), respectively. As depicted, it can be observed that the deposited carbon nanotubes have different structures depending on whether the plasma 104 (or 304) is ON or OFF. When the plasma is ON, while all other deposition parameters remain the same, the MWCNTs form a highly dense and intermingled network with good electrical connectivity, as shown in FIG. 4A. When the plasma is OFF, the deposited MWCNTs form a sparse network with poor electrical connectivity, as shown in FIG. 4B.

It is speculated that when the MWCNT aerosol is introduced into the plasma 104 (or 304), the MWCNTs are activated by the plasma, resulting in a dense network formation upon interaction with the surface. However, when the Plasma is OFF, the only force exerted on the MWCNTs is due to the helium gas and a significant portion of them are probably bound to the walls of the plasma generator 102. As the MWCNTs are dispersed in water, the moisture may play a critical role in the electrical conductivity of the MWCNT s. The electrical properties of the MWCNTs in FIGS. 4A and 4B are different. The electrical resistance between two points in the deposited MWCNT layer of FIG. 4B is higher than that of FIG. 4A.

FIGS. 5A-5D show SEM images of untreated nitro cellulose paper, carbon nanotubes deposited on paper, gold nanoparticles deposited on paper, and silver nanowires deposited on paper, respectively, where the silver nanowire conductive traces, carbon nanotubes, and $SiO_2$ dielectric coating are deposited on transparent flexible cellulose acetate-based substrates, textiles, paper, and thermoplastic material, by use of the system 100 (or 300). In embodiments, the system 100 (or 300) enables a simple integration of processes that conventionally require multiple deposition techniques including high vacuum physical vapor deposition (sputtering), chemical vapor deposition, and lithography. In embodiments, sequential deposition of a scratch-resistant dielectric coating on conductive traces may be performed for printing and patterning, which is essential for flexible electronics device fabrication.

Figure 6A:
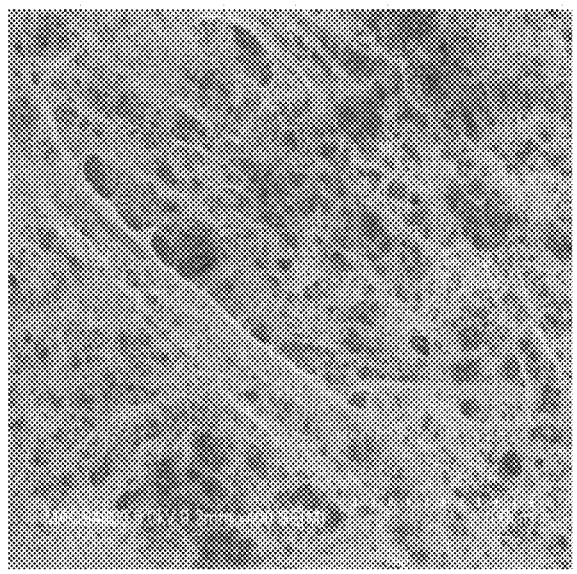
FIG. 6A shows a SEM image of silver nanowires deposited using the system in FIG. 1 (or FIG. 3)
Figure 6B:
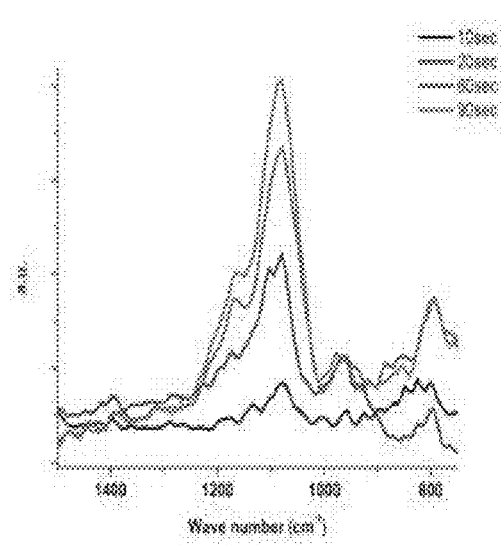
FIG. 6B shows Fourier-Transfer-Infrared-Spectroscopy (FTIR) spectra of dielectric coatings deposited on a silicon wafer using the system in FIG. 1 (or FIG. 3).

In embodiments, silicon dioxide, a most widely used material for interlayer dielectric and gate oxides in integrated circuits may be deposited on a transparent flexible cellulose acetate substrate coated with silver nanowires, to thereby demonstrate the electrical isolation capability and patterning at room temperature. FIG. 6A shows a SEM image of silver nanowires coated on a transparent flexible cellulose acetate substrate and FIG. 6B shows FTIR spectra of dielectric coatings deposited on Si wafer during various time intervals using untreated Si wafer as background. As depicted in FIG. 6B, the peaks at 800 $cm^{-1}$ and 1080 $cm^{-1}$ correspond to bending and asymmetric stretching modes of siloxane bands. The peak at 960 $cm^{-1}$ corresponds to hydroxyl groups, the peak at 1186 $cm^{-1}$ corresponds to methyl silyl vibrations, and the peak at 1280 $cm^{-1}$ corresponds to Si—$CH_3$. As the film density and refractive index are known to decrease in the presence of hydrocarbons, the surface composition and hence the optical characteristics may be tailored by incorporating oxygen into the plasma 104 (or 304). In embodiments, the integration of processes for depositing various electrical components has demonstrated by depositing carbon nanotubes, gold nanoparticles, silver nanowires, and silicon oxide coating.

Figure 7A:
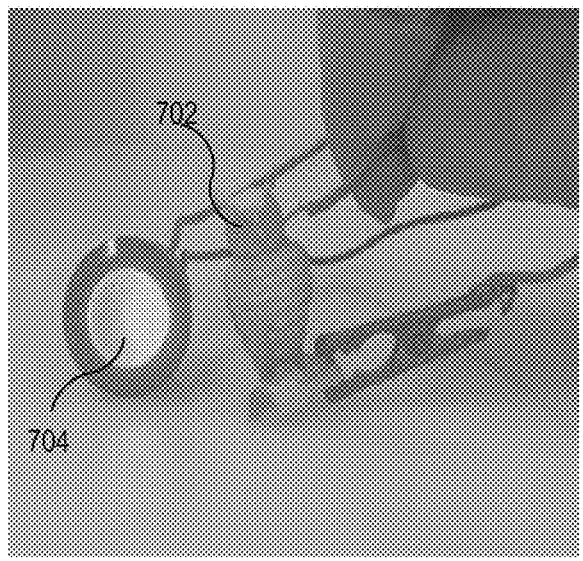
FIG. 7A shows silver nanowires deposited on an exemplary complex three dimensional feature, which has a shape of owl and is made of thermoplastic material, with rough topographical features using the system in FIG. 1 (or FIG. 3).

The 3D printing has significant potential to revolutionize the manufacturing process. Using the system 100 (or 300), the inventors have demonstrated plasma printing of conductive traces on a rough non-uniform 3D object made of acrylonitrile butadiene styrene (ABS) thermoplastic. In embodiments, the integration of electronic components in textiles may be applied to wearable devices for monitoring health of patients, athletes and astronauts. FIG. 7A shows silver nanowires deposited by the system 100 (or 300) on a complex three dimensional feature 702, that has a shape of owl and is formed of thermoplastic material, with rough topographical features. As depicted, one electrode touches the head of the owl 702, while the other electrode touches the foot of the owl 702. The electrical connectivity between silver nanowires deposited on the body surface of the owl is very good and adhesion to rough or uneven surfaces of the owl 702 is high so that the silver nanowires close the circuit between the two electrodes, as evidenced by the test light bulb 704.

Figure 7B:
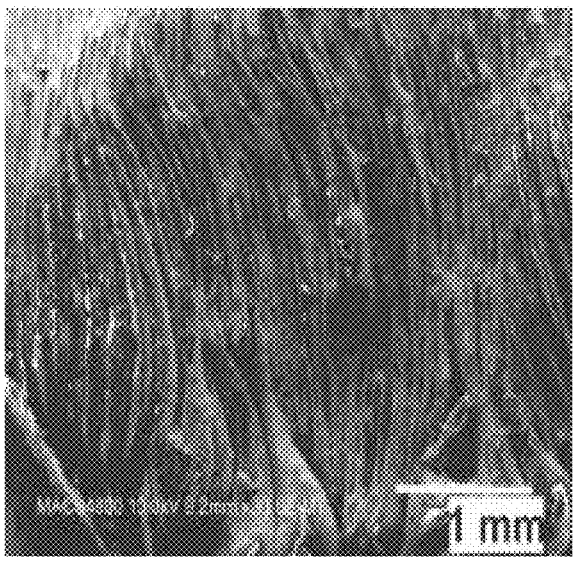
FIGS. 7B-7D show SEM images of a section of the 3D printed owl in FIG. 7A at three different magnifications.
Figure 7C:
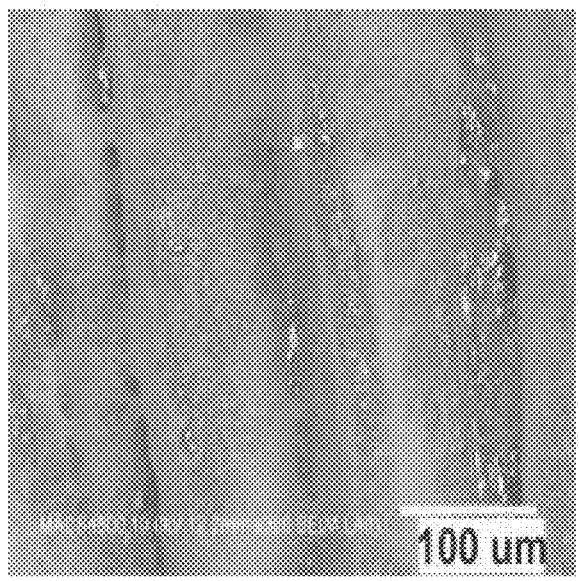
Figure 7D:
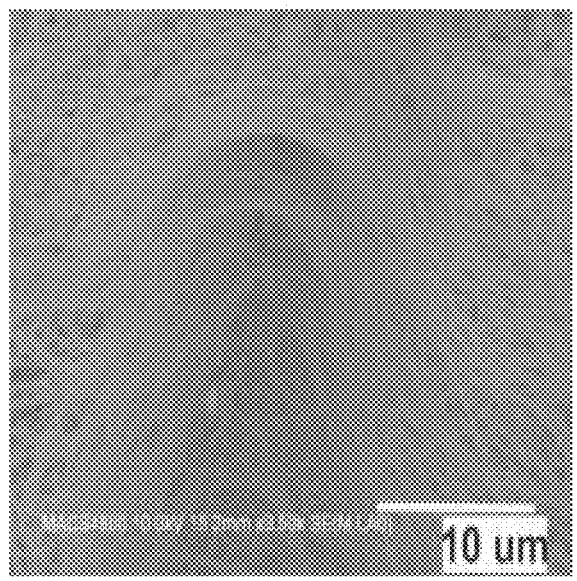

FIGS. 7B-7D show SEM images of a section of the owl 702 at three different magnifications. The SEM images in FIGS. 7B-7D show macroscopic rough features and non-conformal shape of the thermoplastic. Also the SEM images reveal silver nanowires deposited on top of the rough features of the 3D printed owl 702. The plasma printed silver nanowires form a highly inter-linked network covering both shallow and deep gaps between the plastic fibers. The silver nanowires also get deposited on completely non-planar complex shapes without losing the electrical connectivity FIGS. 7A-7D shows that, using the system 100 (or 300), various types of nanowires may be written right over steps and/or other irregularities without compromising good electrical continuity. In embodiments, the advantages of the aerosol combined atmospheric pressure (ACAP) plasma printing process include the ability to deposit various materials, any metal or oxide that is conductive or semi conductive, to a wide range of substrate materials, where the deposition process is independent of the material property of the substrates. In embodiments, the 3D printing process may enable a technician to stop the polymer definition at certain points, deposit a patterned conductive layer, resume deposition, and add more wires, so on. In embodiments, the deposition of gold nanoparticles shown in FIG. 5C may be applied to printing interconnects and gold plating.

For wearable monitoring devices, it is essential that the electronic components of the devices function after stretching, folding and/or heavy deformation. In embodiments, to demonstrate the applicability of the aerosol combined atmospheric pressure plasma 104 (or 304) to printing wearable monitoring devices, the silver nanowires may be deposited on cotton textile and the electrical resistance may be measured using digital multimeter. The cotton textile may be deformed to various shape and the electrical resistance may be measured under every deformation condition. In embodiments, it is observed that the electrical connections stayed intact upon heavy deformation, demonstrating the robustness of the deposited layer and its applicability to printing electronic components in wearable monitoring devices.

The plasma processing technology established in semiconductor industry has been exploited by the biodiagnostic sectors for fabricating biosensor chips. A central issue to be addressed in the fabrication of low cost point of care biodiagnostics chips is how to activate the surface of devices mass-produced in a way that is compatible with large-scale production and is reliable and controllable. In embodiments, the ACAP plasma printing approach may lend itself to high-volume manufacture of biosensor chips in a single process akin to that used in the conventional semiconductor industry.

Surface functionalization and signal amplification are key components of biosensor device fabrication. Surface functionalization is essential for immobilizing the bioreceptor molecules and reducing the non-specific binding of non-analyte constituents. Amine functionalization is a surface chemical modification for covalent immobilization of bioreceptor molecules. Gold nanoparticle may be used for signal amplification in plasmonics-based detection. In embodiments, deposition of amine functionalities and gold nanoparticles may be performed using the system 100 (or 300). In embodiments, paper sensors that use filter paper as biosensor chip may be fabricated using the system 100 (or 300).

In general, paper-based biosensing uses filter paper (nitro cellulose) as the platform for fluid transport and as biosensor chips. In order to use filter paper as biosensor chips, the paper needs to be modified to incorporate the following features: (a) microfluidics/patterning for fluid transport, (b) nanostructures for biomolecule detection and/or signal amplification/transduction, (c) chemical functionalization for bioassays, and (d) surface modification for fluid flow.

In general, the conventional development of multifunctional paper platform by combining any two or all of the above features requires several sequential processing steps and use of different platforms/tools including high precision printing, patterning, lithography, drop casting, and drying. There is no one single tool that can perform most of the functions required in the fabrication process and at the same time provide high sensitive chip surfaces. In embodiments, for the fabrication of paper based sensors, the system 100 (or 300) may be used to incorporate the features listed above.

Figure 8:
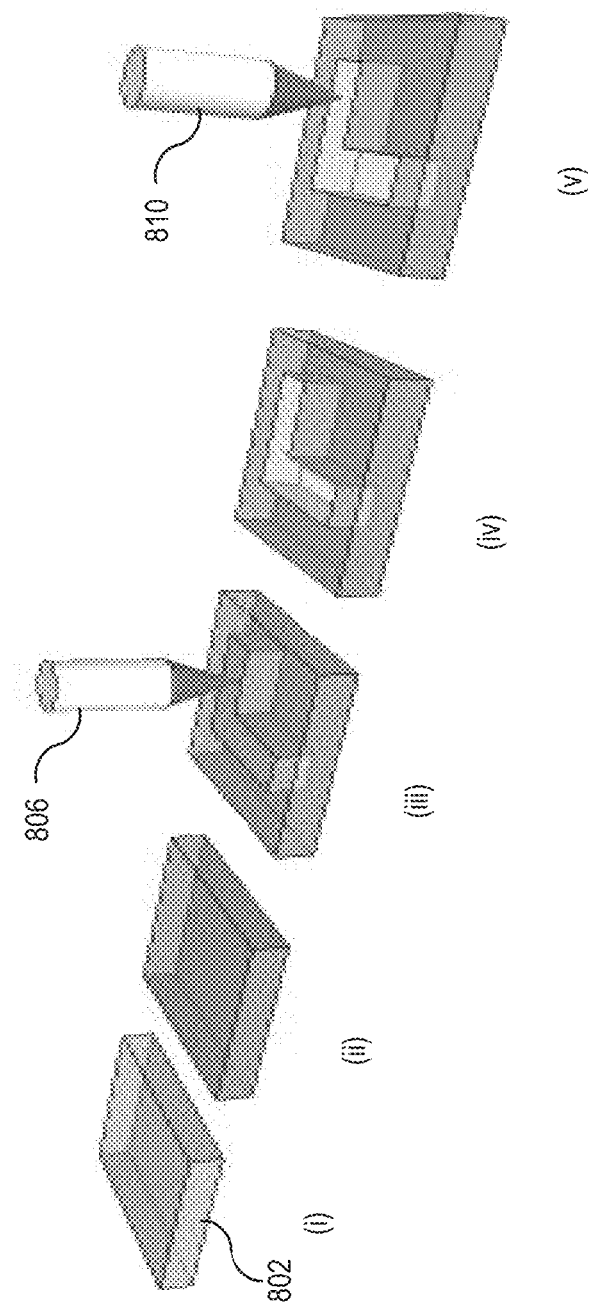
FIG. 8 shows exemplary steps for patterning paper using a maskless lithography technique, where the system in FIG. 1 (or FIG. 3) is used as the light source.

Lithography process: In embodiments, lithography process may be carried out on paper using a photoresist, such as Microposit UV6® positive photoresist. The atmospheric pressure plasma 104 (or 304) may be used as both a maskless patterning tool and a UV light source. The patterned paper after exposure to plasma may be developed using Microposit LLd26® tetramethyl ammonium hydroxide developer and hard baked for 90 seconds at 60° C. The region containing the photoresist is hydrophobic and the regions treated with plasma act as hydrophilic channels. FIG. 8 shows exemplary steps for patterning paper using a maskless lithography technique, where the system 100 (or 300) is used as the light source. From left to right, the steps include: (i) preparing untreated filter paper 802, (ii) dipping the untreated filter paper in photoresist, such as Microposit UV6® positive photoresist, and soft baking the dipped filter paper, (iii) exposing the soft-baked filter paper to plasma 806 (which corresponds to 104 or 304) for maskless patterning, (iv) dipping the exposed filter paper in developer and hard baking the dipped filter paper, and (v) treating the hard baked filter paper for hydrophilicity using the plasma 810 (which corresponds to 104 or 304), to thereby generate lithographically patterned paper. In FIG. 8, the plasma 806 and 810 may be generated by the system 100 (or 300) and used to perform site selective treatment of the paper.

Figure 9:
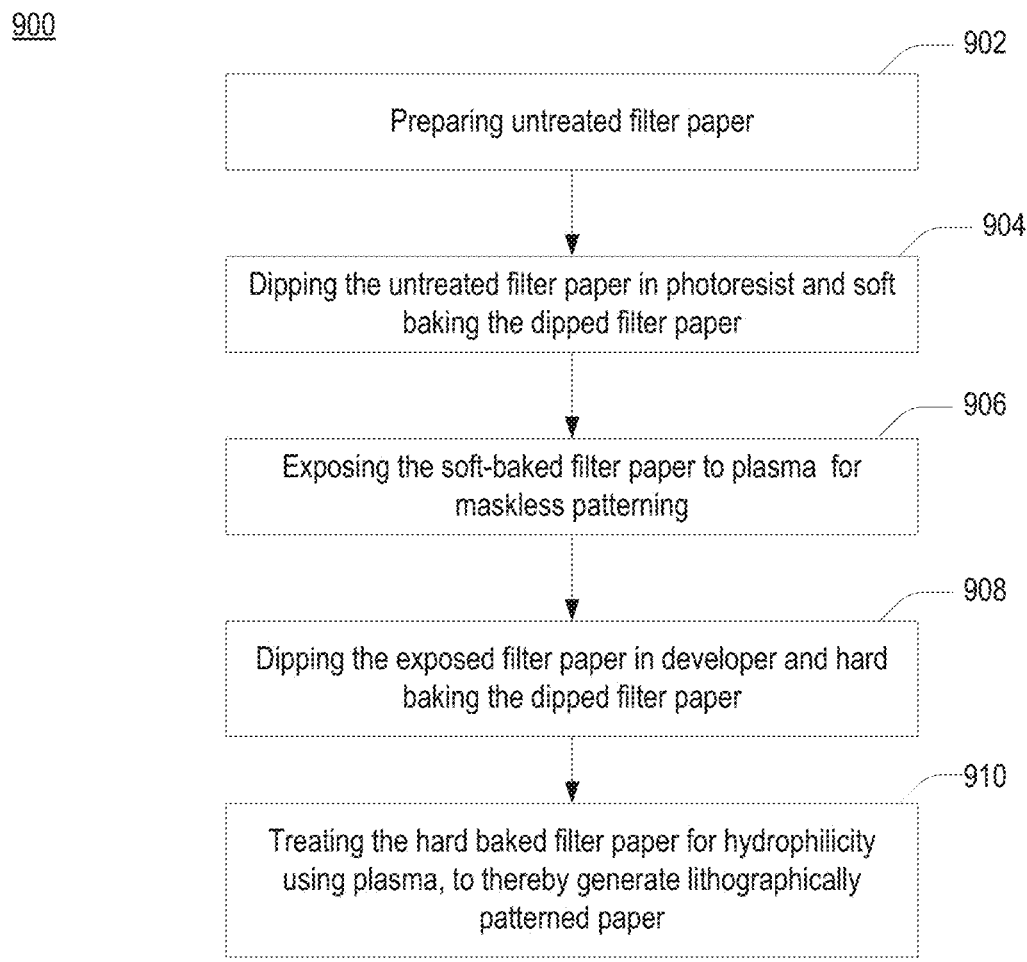
FIG. 9 is a flowchart of an exemplary method for patterning paper using a maskless lithography technique according to embodiments of the present invention.

FIG. 9 is a flowchart 900 of an exemplary method for patterning paper using a maskless lithography technique according to embodiments of the present invention. At step 902, untreated filter paper 802 is prepared. Then, at step 904, the untreated filter paper is dipped in photoresist, such as Microposit UV6® positive photoresist, and soft baked. Next, the soft-baked filter paper is exposed to plasma 806 (which corresponds to 104 or 304) for maskless patterning at step 906. At step 908, the exposed filter paper is dipped in developer and the dipped filter paper is hard baked. Finally, at step 910, the hard baked filter paper is treated for hydrophilicity using the plasma 810 (which corresponds to 104 or 304), to thereby generate lithographically patterned paper.

Figure 10:
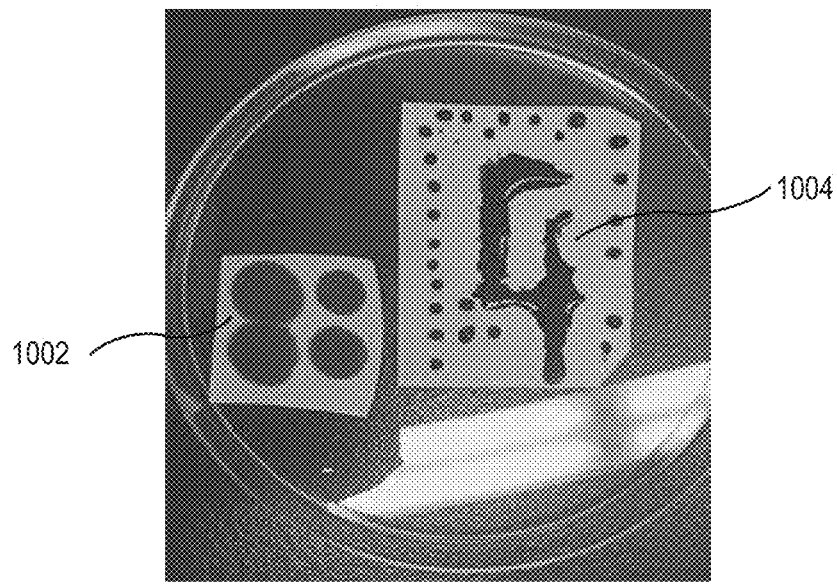
FIG. 10 shows patterns of liquid droplets placed on untreated filter paper and filter paper that is lithographically patterned according to the method of FIG. 9.

In embodiment, the paper patterned by the steps in FIG. 9 may be tested with various organic solutions and colloids. The hydrophobic and hydrophilic regions are clearly observed when liquid droplets are placed on the patterned paper. FIG. 10 shows patterns of liquid droplets of potassium permanganate solution placed on untreated filter paper 1002 and filter paper 1004 that is lithographically patterned according to the method of FIG. 9. As depicted, the droplets placed on the untreated filter paper 1002 spread isotropically into the untreated filter paper 1002 while the droplets placed on the patterned paper 1004 are retained due to the hydrophobicity of the paper and flow along a hydrophilic channel formed by the plasma patterning process.

Figure 11:
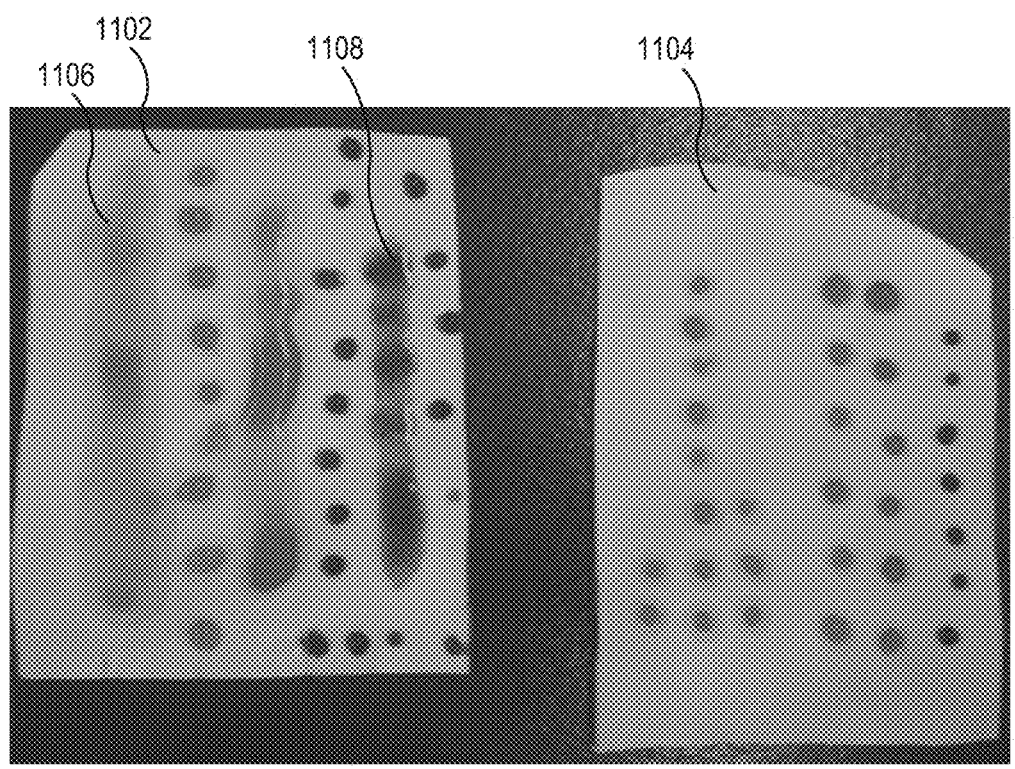
FIG. 11 shows patterns of liquid droplets placed on paper that is lithographically patterned according to the method of FIG. 9 and on photoresist paper that is not patterned.

FIG. 11 shows patterns of liquid droplets placed on paper 1102 that is lithographically patterned according to the method of FIG. 9 and on photoresist paper 1104 that is not patterned. The lithographically patterned paper 1102 is patterned by the plasma 802 to include both hydrophobic regions and hydrophilic channels. The first liquid 1106 is cy3 labeled fluorophore and the second liquid 1108 is carbon nanotube dispersed in water. As depicted, the first and second liquid droplets placed on the patterned paper 1102 retain their shapes in hydrophobic regions and flow along the hydrophilic channels, while the liquid droplets placed on the patterned paper 1104 retain their shapes but do not flow since the entire unpatterned paper 1104 is hydrophobic.

Nanostructures and organic functionalities deposited on nitro cellulose filter paper for biosensing: In biodiagnostics based on bioassays, detection of target analytes including DNA, protein, enzyme, etc., from biological samples including blood, urine, sweat, saliva, etc., involves binding of probe molecule that can be a single stranded oligo or a primary antibody to the biosensor surface, which will then react with the complementary biomolecule in the biological samples. Covalent immobilization of the probe molecule to the sensor surface is preferred over physisorption or non-covalent binding. Bio-reactive organic functional groups, such as amines, carboxyls, thiol, and aldehyde, are widely used for covalent immobilization of the probe to the surface. Functionalizing the sensor chip with amines, carboxyls, thiol, or aldehyde, would enable covalent immobilization of the biomolecule to the sensor surface using appropriate cross linkers. However, in order to reduce the non-specific binding of non-analyte constituents from the biological samples, that gives rise to false positives, the sensor surface is coated with bio-fouling polyethylene glycol or with albumin. Varying chain lengths of polyethylene glycol are commercially available. Low pressure, vacuum chamber based, plasma deposition of bio-reactive amine, carboxyl groups, and biofouling polyethylene glycol (PEG) has been developed by conventional approaches. However, the drawback of the conventional low pressure plasma depositions is that the entire sensor surface is coated and site selective deposition is not possible without a vacuum seal mask.

In embodiments, bio-reactive and bio-fouling coatings may be deposited using a maskless, atmospheric pressure plasma 104 (or 304) and the depositions are carried out site selectively. Bio-reactive amine functional group may be deposited using amino propyl triethoxy silane (APTES) and the bio-repellent Polyethylene Glycol (PEG) is deposited using diethylene glycol dimethylether. Both the precursors are individually introduced to the plasma 104 (or 304) and directed towards the surface to be coated. The monomer precursors are plasma polymerized upon deposition on the sensor surface by the plasma jet. Amine terminated Cy3 labeled oligos are immobilized on plasma deposited paper sensors. In conventional approaches, in order to covalently bind the biomolecule to the amine functionalized surface, an appropriate cross linker may be used. However, in embodiments, binding of biomolecule directly onto the amine functionalized surface without cross linker may be achieved due to non-specific binding. In embodiments, gold nanoparticles are deposited by aerosolizing the gold colloid, where the amine functional group has good affinity to the gold colloid. In embodiments, nitro cellulose filter paper may be used as substrate for depositions. In embodiments, some of the samples are tested with fluorescence microscope.

Figure 12A:
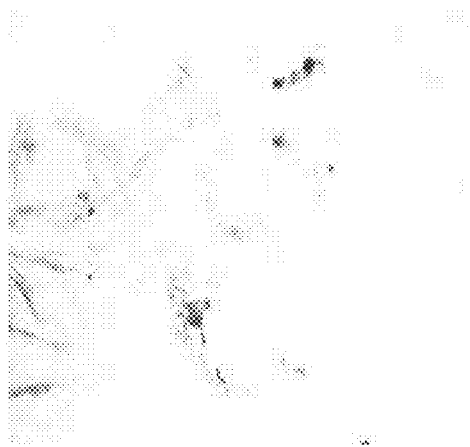
FIGS. 12A-12E shows microscopic fluorescence images of paper sensors immobilized with single strand DNA containing Cy3 flourophore according to embodiments of the present invention.
Figure 12B:
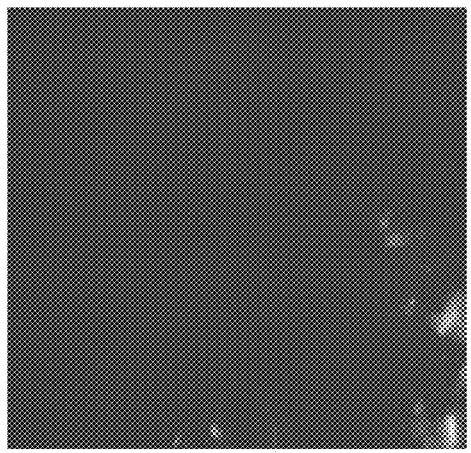
Figure 12C:
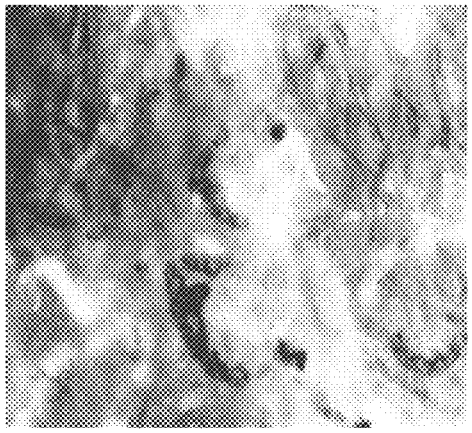
Figure 12D:
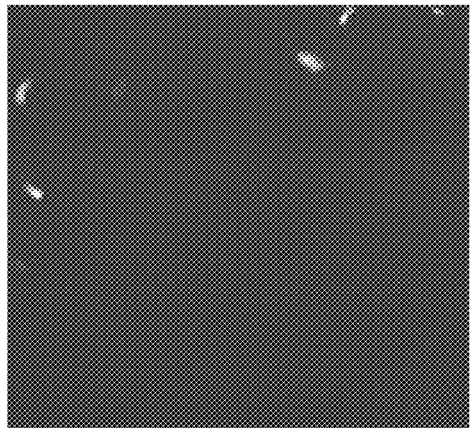
Figure 12E:
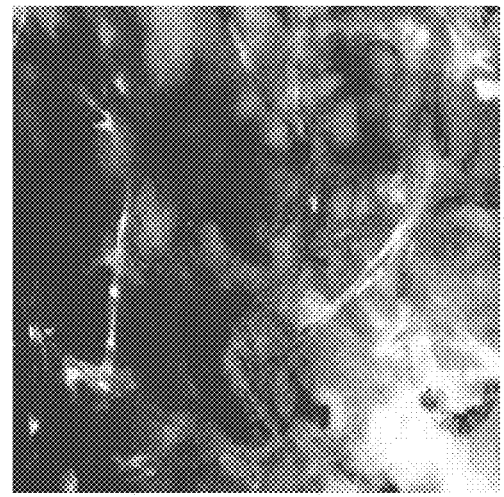

FIGS. 12A-12E are microscopic fluorescence images of paper sensors immobilized with single strand DNA containing Cy3 flourophore according to embodiments of the present invention. In FIG. 12A, the intensity of signals from paper sensor containing gold nanoparticles is very high since amine terminated oligos have high bending capacity to gold surface. In FIG. 12B, the intensity of signal from on amine functionalized paper sensor is very low since there is no binding of amine terminated oligos. The amine functionalized surface repels the amine terminated oligos and hence there is no or less binding. In 12C, the intensity of signal from amine functionalized paper sensor with gold nanoparticles on top (sequential plasma deposition) is again high, demonstrating a high binding of the oligos to the gold nanoparticle surface. In FIG. 12D, the image of polyethylene glycol (PEG) functionalized paper sensor indicates that there is no binding since the PEG is used to reduce non-specific binding. In FIG. 12E, the image of PEG functionalized paper sensor containing gold nanoparticles on top (sequential deposition) indicates that there is a high binding due to gold-amine affinity. FIGS. 12A-12E demonstrate the capability of the system 100 (or 300) for depositing nanostructures and various organic bioactive and biorepellent functionalities.

Figure 13A:
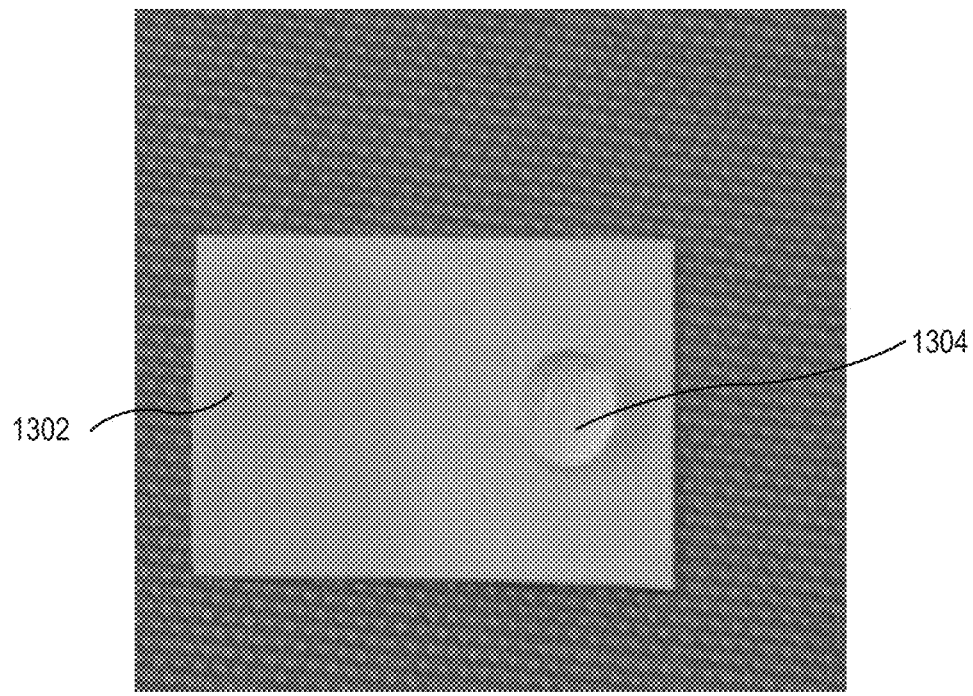
FIGS. 13A and 13B are top and side views of water droplets placed on filter paper, respectively, where a portion of the filter paper is treated using the system in FIG. 1 (or FIG. 3).
Figure 13B:
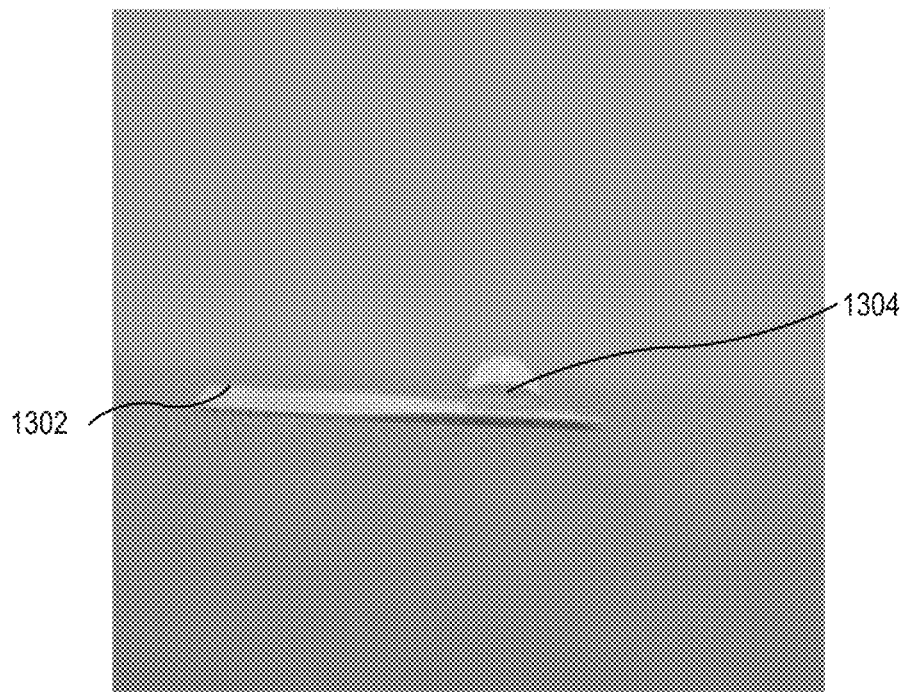

FIGS. 13A and 13B are top and side views of water droplets 1302 and 1304 placed on filter paper, respectively, where a portion of the filter paper is treated using the system 100 (or 300). As depicted, the water droplet 1302 placed on the untreated hydrophilic region is completed soaked into the paper, while the water droplet 1304 placed on hydrophobic regions coated with amine functionalities retains its spherical shape forming an angle with respect to the surface of the paper.

In embodiments, the system 100 (or 300) may be applied to various applications, such as, but not limited to, high throughput, low cost printing and patterning of flexible electronics, electrical connects, insulating coating; in-space manufacturing of biosensors, flexible electronics and printing for long duration missions; fabricating low cost and disposable biodiagnostics chips; and monitoring astronaut health and biosensing in microgravity environments.

In embodiments, the system 100 (or 300) may be used to deposit conductive traces and/or semiconducting regions on substrates, using precursor colloids containing a high density of carbon nanotubes and/or metal micro/nanostructures or conductive polymers. In embodiments, the necessary requisite of the process includes a combination of low temperature atmospheric pressure plasma and aerosol containing the material to be deposited. The deposition may be caused by the interaction of the aerosol with the plasma 104 (or 304) containing a primary gas. The role of atmospheric pressure plasma 104 (or 304) includes: (i) activating the material, present in the aerosol, to be deposited and the surface to be coated, (ii) enhancing the adhesion of the material to be deposited on the surface, (iii) facilitating non-aggregated deposition in case of metal nano/microstructures through electrostatic interactions and repulsions caused within the plasma jet and facilitating plasma polymerization in case of organic and inorganic coating deposition through formation of reactive radicals and ions as the aerosol enters the plasma jet, and (iv) performing post deposition plasma treatment to remove moisture in nanostructures and/or to change the surface tension of coatings. In embodiments, the deposited conductive traces may be used in the fields of electronics, solar panels, wearable monitors, electronic textiles, 3D printing, and biosensors for biomolecule mobilization and/or signal transduction.

In embodiments, the system 100 (or 300) may be used to deposit functional coatings on a two or three dimensional substrate or a porous substrate using either volatile or non-volatile precursors or a combination of the two. The functional coatings may include conducting polymers for electronics application to form conductive traces, dielectric coatings like silicon oxide and high and low k dielectrics coatings, organic coatings containing functional groups like that of amines, carboxyl, aldehyde, carbonyl, polyethylene glycol, fluorinated compounds, fluoro polymer, hydroxyl, ethylene oxide, ethylene glycol, alcohol, polyvinyl alcohol, hydrogels, poly hydroxyethyl meth acrylate, diethylene glycol dimethyl ether, positively and negatively charged coatings for various applications including electronics, biosensors, and printing. In embodiments, during such depositions, the functionality of the plasma-deposited coating is retained such that the required surface characteristics, such as appropriate film thickness, concentration and density of materials deposited, and percentage coverage, may be achieved by adjusting appropriate plasma parameters. In embodiments, to improve the performance of the coating, appropriate pre-processing by use of the plasma may be carried out and primary coatings may be deposited prior to the required functional coating.

In embodiments, the system 100 (or 300) may be used to perform co-deposition or sequential deposition of one or more of the followings: micro/nanostructures, semiconductors, dielectric, organic coating, inorganic coating, and oxide functional coating. The deposited micro/nanostructures, semiconductors, dielectric, organic coating, inorganic coating, and oxide functional coating may either be overlapping or separated by a distance on a single substrate.

In embodiments, the system 100 (or 300) may be used to perform patterning the substrate dipped into a photoresist material as a maskless direct-write lithography tool and creating (i) hydrophobic and hydrophilic regions/channels, (ii) biomolecule binding and bio fouling sites, and (iii) signal amplification and/or signal transduction element deposited in the form of nanostructure on the substrate. In embodiments, the following parameters may be controlled: the time duration of plasma treatment, UV exposure, concentration, density and thickness of materials deposited, percentage coverage, film characteristics, drive voltage of the electrodes 152*a* and 152*b*, the electrode configuration, distance between the substrate 130 and electrodes 152, electrode separation, nature and type of primary gas and aerosol flow, diameter of the tube 115 used to direct the gas flow, flow rates, and relative flow ratio.

In embodiments, the micro/nanostructures in the precursor include conductive materials including carbon nanotubes, metal nanowires/nanorods/nanospheres/nanoprisms/nanotubes/nanopowders of gold, silver, platinum, copper, aluminum and other metals; semiconductor materials with p type, n type, low bandgap and wide bandgap materials including nanowires/nanorods/nanospheres/nanoprisms/nanotubes/nanopowders of silicon, germanium, zinc oxide, zinc telluride, tin oxide, gallium arsenide, gallium nitride, and boron nitride; and iron oxide and magnetic nanoparticles and nanoparticles containing different materials as core and shell.

In embodiments, the system 100 (or 300) may be operated on the ground or in space under microgravity.

In embodiments, the micro/nanostructures deposited by the system 100 (or 300) may be used to: (i) create an electrical connect and act as an electrically conductive path, (ii) serve as a photo voltaic material to generate and/or transmit electrical current, (iii) serve as a sensor material for gas sensing, biomolecule sensing, and radiation sensing, (iv) serve as electrical components for wearable monitoring devices, electronic-textiles, 3D printed objects, and flexible substrates, (v) act as a biomolecule binding agent in biosensors, and (vi) serve as a signal transduction element and/or signal amplification component for biosensors based on electrical detection, electro-chemical detection, colorimetric detection, surface plasmon resonance detection, and fluorescence detection.

In embodiments, the system 100 (or 300) may be used to perform pre-processing and depositing primary coatings, where the purpose of the pre-processing and primary coatings is to enhance the adhesion of the functional coating to be deposited and to increase the concentration of functionality in the resultant coating by providing favorable sites for film growth/deposition. The pre-processing may involve plasma treatment of the sample with primary gas flow and with no precursor in the plasma. Primary coating may involve any siloxane, silane based coatings deposited that aids favorable growth of functional groups.

In embodiments, the system 100 (or 300) may be used to deposit semiconductor coatings that include zinc oxide, zinc telluride, tin oxide, silicon, germanium, zinc oxide, zinc telluride, gallium arsenide, gallium nitride, boron nitride, or the combination thereof.

In embodiments, the substrate 130 on which plasma printing is carried out may include nitro cellulose paper, cellulose acetate transparent material, thermoplastic materials, flexible materials, transparent materials, metals, semiconductors, ceramics, insulators, wood, cotton textile, silk textile, thermosetting plastic, elastic materials, thermoplastic materials, electrical components, cloths, polymers, leather, wearable materials, stretchable materials, and combination thereof.

In embodiments, the system 100 (or 300) may be used to deposit insulating coating, dielectric coating, primary coating and perform pre-processing, where the precursor may include silicon oxide, silicon dioxide ($SiO_2$) and SiOxCyHz type coatings using one or more of the following precursors: (i) hexamethyl disiloxane, (ii) tetraethyl ortho silicate, and (iii) amino propyl triethoxy silane.

In embodiments, the precursor for PECVD including tetra ethyl orthosilicate (TEOS), hexamethyldisiloxane, octamethylcyclotetrasiloxane, aminopropytl triethoxy silane (APTES), acrylic acid, allyl amine, etc. may be used without dilution or further processing from the suppliers. The concentration of the micro/nanocolloids may be varied from 1 microgram/milliliter to 10 milligram/milliliter, depending on the density of loading required upon deposition.

In embodiments, the precursor for dielectric coating may include silica, silane, siloxane, polystyrene, polyurethane, acrylics, polyester, rayon, nylon, fluoro polymers, poly tetra flouro ethylene (PTFE), rubber, resin, polycarbonate, poly methyl meth acrylate (PMMA), poly dimethylsiloxane (PDMS), polyvinyl alcohol, hydrogels, cellulose, or combination thereof.

In embodiments, the precursor for functional coating includes chemicals/compounds containing amines, carboxyl, aldehyde, carbonyl, polyethylene glycol, fluorinated compounds, fluoro polymer, hydroxyl, ethylene oxide, alcohol, polyvinyl alcohol, hydrogels, or combination thereof. In embodiments, the functional coatings may include biofouling and/or biomolecular repellent coating for reducing the non-specific binding and contains ethylene glycol, poly hydroxyethyl meth acrylate, diethylene glycol dimethyl ether, poly ethylene oxide, poly ethylene glycol (PEG), PEG chains containing reactive functional groups like amine, carboxy, or the combination thereof. The PEG chains with molecular weight ranges from 1 g/mol to 100,000 g/mol. In embodiments, the biomolecule may include at least one of (i) oligos, (ii) DNA, (iii) antibody, (iv) protein, (v) enzyme, (vi) aptamer, (vii) cells, (viii) peptides, (ix) platelets, and (x) tissues.

In embodiments, the system 100 (or 300) may be used to deposit biofouling coatings, where the purpose of the biofouling coating is to reduce or avoid non-specific binding of biomolecules and/or to avoid false positive in diagnostics and also to prevent loss of analyte in the sensor chip before it is detected. In embodiments, the non-specific binding may correspond to binding of any or all non-analyte constituents in the sample to be tested to the sensor surface. The non-specific binding may also correspond to binding of the analyte or loss of analyte before the analyte reaches the detection site.

In embodiments, the separation distance between different functionalities/coatings may vary from 1 µm to several meters.

In embodiments, the substrate 130 may be made of semiconductors, dielectrics, metals, metal oxides, ceramics, plastics, polymers, glass, composites, cotton, all types of cellulose fibers, creating paper or similar substrates, glass microfiber filters, glass microfiber cloth, microfluidic platform made of silicon, polydimethylsiloxane, poly carbonate, cyclo olefin polymer, glass, or combination thereof. In embodiments, the substrate 130 may be made of silicon, germanium, gold, silver, platinum, iron, copper, silicon oxide, titanium oxide, acrylics, polyester, rayon, nylon, fluoro polymers, poly tetra flouro ethylene (PTFE), rubber, resin, polycarbonate, poly methyl meth acrylate (PMMA), poly dimethylsiloxane (PDMS), cyclo olefin polymer filter papers, nitro cellulose papers, or combination thereof. In embodiments, the fibers of cellulose may vary in size from 10 nm to 100 µm. In embodiments, the substrate 130 may have from simple two dimensional to complex three dimensional geometry that may be planar, curved, smooth, rough, porous, rigid, flexible, or deformable. In embodiments, the dimension of the substrate 130 may range from a micron to several meters.

In embodiments, the thickness of film deposited by the system 100 (or 300) may range from 1 nm to 100 µm.

In embodiments, the system 100 (or 300) may generate UV radiation using the primary gas flow or a precursor including water. In embodiments, before treatment by the UV radiation, the substrate may be dipped in a photoresist material, such as epoxy based SU-8, or cyclized poly isoprene based series, where the thickness of the photoresist may vary from 10 nm to 10 µm.

In embodiments, the precursor may be of any chain length and include monomers and/or polymers of any molecular weight.

In embodiments, the size of micro/nanostructures included in the precursor may range from 1 nm to 100 µm in diameter for spherical/globular particles, 1 nm to 1 cm in length for wires, tubes and rods with a cross sectional diameter ranging from 1 nm to 100 µm, and 1 nm to 100 µm in length for prisms.

In embodiments, multiple precursors for deposition may be introduced into one or more plasma jets 304 either sequentially or simultaneously through one or multiple carrier gases in the form of aerosol.

In embodiments, a combination of nanostructures, organic functionalities containing bio active and bio repellent sites may serve multiple purposes, such as (i) specific binding of analyte constituent, (ii) reduction of non-specific binding of non-analyte constituent, (iii) signal amplification, (iv) signal transduction, and (v) prevention of loss of analyte in a sensor chip before it is detected.

It will be appreciated to those skilled in the art that the preceding examples and embodiment are exemplary and not limiting to the scope of the present invention. It is intended that all permutations, enhancements, equivalents, combinations, and improvements thereto that are apparent to those skilled in the art upon a reading of the specification and a study of the drawings are included within the true spirit and scope of the present invention.

What is claimed is:

1. A method of printing, comprising:
   (a) generating atmospheric pressure plasma in an outer dielectric tube comprising two electrodes;
   (b) pretreating a surface of a substrate to be printed by exposing said surface to the generated atmospheric pressure plasma;
   (c) exposing one or more precursor materials flowing through an inner chamber to the generated atmospheric pressure plasma, wherein a part of said inner chamber is contained within a part of said outer dielectric tube, thereby shielding said one or more precursor materials from being ignited from exposure to an electrode junction;
   (d) printing said one or more plasma-exposed precursor materials onto said surface of said substrate; and
   (e) post-treating said surface by exposing said surface after the printing step to the generated atmospheric pressure plasma.

2. The method of claim 1, wherein said outer dielectric tube comprises a distal conical end through which said plasma-exposed precursor material flows through for printing on said substrate.

3. The method of claim 1, wherein said printing comprises printing one or more patterns on said surface of said substrate.

4. The method of claim 1, wherein steps (a)-(e) are performed using a plasma jet print head comprising said outer dielectric tube and said inner chamber.

5. The method of claim 2, wherein said one or more precursor materials are exposed to atmospheric pressure plasma of room temperature in said distal conical end of said outer dielectric tube.

6. The method of claim 1, wherein said steps (a)-(e) can be repeated one or more times.

7. The method of claim 6, wherein each time steps (a)-(e) are repeated, the one or more precursor materials are the same one or more precursor materials.

8. The method of claim 6, wherein each time steps (a)-(e) are repeated, the one or more precursor materials are different for at least one repetition.

9. The method of claim 1, wherein step (a) further comprising applying voltage of about 200 V to about 15 kV to said two electrodes of said outer dielectric tube to generate said atmospheric plasma.

10. The method of claim 1, wherein step (a) further comprises supplying one or more gases into said outer dielectric tube.

11. The method of claim 10, wherein one of said one or more gases is an inert gas.

12. The method of claim 10, wherein one of said one or more gases is a reactive gas.

13. The method of claim 10, wherein said one or more gases has a flow rate of about 50 sccm to about 5000 sccm.

14. The method of claim 1, wherein said atmospheric plasma is generated throughout steps (a)-(e).

15. The method of claim 1, wherein said substrate comprises plastic, ceramic, paper, textile, composite, glass, metal, or a combination thereof.

16. The method of claim 1, wherein said substrate is flexible, rigid, deformable, porous, smooth, planar, stretchable, or a combination thereof.

17. The method of claim 6, wherein steps (a)-(e) are repeated until a layer of said one or more plasma-exposed precursor material with a thickness of about 1 nm to about 100 μm is formed on a surface of said substrate.

18. The method of claim 1, wherein said one or more precursor materials comprises amine, carboxy, aldehyde, carbonyl, polyethylene glycol, fluorinated, hydroxyl, ethylene oxide, ethylene glycol alcohol, polyvinyl alcohol, hydrogels, positively charged coatings, negatively charged coatings, or a combination thereof.

19. The method of claim 1, wherein at least one of said one or more precursor materials have a bio-reactive and/or bio-fouling property.

20. The method of claim 1, wherein said one or more precursor materials comprises a plurality of organic monomers and a plurality of inorganic monomers, wherein said plurality of organic monomers and said plurality of inorganic monomers polymerize upon exposure to said atmospheric pressure plasma and/or upon contact with a surface of said substrate.

21. The method of claim 1, wherein said one ore more precursors are aerosolized before entry into said inner chamber.

22. The method of claim 21, where said aerosolized one or more precursors have a flow rate of about 1 μL/min to 5 mL/min within said inner chamber.

23. The method of claim 1, wherein said substrate comprises one or more nanowires, one or more nanorods, one or more nanospheres, one or more nanoprisms, one or more nanotubes, one or more nanopowders, or a combination thereof.

24. The method of claim 1, wherein said outer dielectric tube has a diameter of about 100 μm to about 5 cm, a length of about 1 cm to about 10 cm, and a distance between said two electrodes of about 5 mm to about 5 cm.

25. The method of claim 2, wherein said distal conical end comprises a nozzle outlet through which said one or more plasma-exposed precursor materials flow from said outer dielectric tube to print on said surface of said substrate, and wherein a diameter of said nozzle outlet can be controlled to vary a spot size of printing of said one or more plasma-exposed precursor materials.

26. The method of claim 3, wherein said substrate is three dimensional (3D), said one or more precursor materials comprise a metal, and said one or more patterns is a conductor.

27. The method of claim 1, wherein said one or more precursors materials are silver and copper; platinum and copper; silicon dioxide and nitrogen, or silicon dioxide and gold.

28. The method of claim 1, wherein said one or more precursor materials comprises a metal comprising copper, silver, platinum, gold, zinc aluminum, tin, or a combination thereof.

29. The method of claim 1, wherein said steps (a)-(e) are used to print one or more functional coatings for biomolecule attachment.

30. The method of claim 1, wherein said steps (a)-(e) are used for a biorepellant application.

* * * * *